US012635113B1

(12) United States Patent
Munishamappa et al.

(10) Patent No.: US 12,635,113 B1
(45) Date of Patent: May 19, 2026

(54) APPARATUSES, SYSTEMS, AND METHODS FOR MOUNTING CHASSIS IN A SHORT DEPTH SERVER RACK

(71) Applicant: Juniper Networks, Inc., Sunnyvale, CA (US)

(72) Inventors: Basavaraja Munishamappa, Bangalore (IN); Muthuraj Madasamy, Bangalore (IN); Senthil Kumar Ramaswamy Venkat, Bangalore (IN)

(73) Assignee: Hewlett Packard Enterprise Development LP, Spring, TX (US)

( * ) Notice: Subject to any disclaimer, the term of this patent is extended or adjusted under 35 U.S.C. 154(b) by 256 days.

(21) Appl. No.: 18/364,794

(22) Filed: Aug. 3, 2023

(51) Int. Cl.
    *H05K 7/20*      (2006.01)
    *H05K 7/14*      (2006.01)

(52) U.S. Cl.
    CPC ....... *H05K 7/20736* (2013.01); *H05K 7/1489* (2013.01); *H05K 7/20172* (2013.01); *H05K 7/20572* (2013.01)

(58) Field of Classification Search
    CPC .... H05K 7/1489; H05K 7/16; H05K 7/20736; H05K 7/1488; H05K 7/1497; H05K 7/20781; H05K 5/0256; H05K 7/14; H05K 7/1487; H05K 7/20172; H05K 7/20572; H05K 7/18; H05K 7/20; H05K 7/20581; H05K 7/20809; A47B 51/00; A47B 67/04; A47B 88/42; A47B 88/48; A47B 2200/0083; A47B 63/00; G06F 1/181; G06F 1/183; G11B 33/02; G11B 33/128
    See application file for complete search history.

(56) References Cited

U.S. PATENT DOCUMENTS

| | | | | |
|---|---|---|---|---|
| 2,857,558 A * | 10/1958 | Fiske | ..................... | B65D 85/38 |
| | | | | 324/756.01 |
| 4,258,967 A * | 3/1981 | Boudreau | .............. | A47B 88/48 |
| | | | | 312/273 |
| 5,584,396 A * | 12/1996 | Schmitt | .................... | H02B 1/36 |
| | | | | 211/26 |
| 6,082,845 A * | 7/2000 | Eizadkhah | ............... | H05K 7/16 |
| | | | | 312/223.1 |
| 6,330,161 B1 * | 12/2001 | Smith | ..................... | G06F 1/181 |
| | | | | 16/265 |
| 6,643,130 B1 * | 11/2003 | DeMarchis | ........ | H05K 7/20181 |
| | | | | 361/695 |
| 6,826,055 B2 * | 11/2004 | Mease | ..................... | G06F 1/186 |
| | | | | 361/725 |
| 7,724,543 B2 * | 5/2010 | Ozawa | .................. | H05K 7/1489 |
| | | | | 361/826 |
| 8,424,983 B1 * | 4/2013 | Strauss | .................. | A47B 51/00 |
| | | | | 312/247 |
| 8,804,341 B2 * | 8/2014 | Hsiao | ..................... | B65D 81/05 |
| | | | | 312/271 |
| 10,405,648 B2 * | 9/2019 | Pappas | .................. | A47B 19/02 |
| 12,075,590 B2 * | 8/2024 | Aman | .................. | H05K 7/1489 |
| 2006/0010456 A1 * | 1/2006 | Ishimine | .............. | G11B 33/142 |

(Continued)

*Primary Examiner* — Michael A Matey
(74) *Attorney, Agent, or Firm* — Juniper Networks, Inc.

(57) ABSTRACT

Server racks may include an enclosure with an airflow inlet in a first lateral sidewall and an airflow outlet in a second, opposite lateral sidewall. A support structure may be rotatably mounted to the enclosure and rotatable between an open position and a closed position. Various other apparatuses, systems, and methods are also disclosed.

19 Claims, 9 Drawing Sheets

(56)     References Cited

U.S. PATENT DOCUMENTS

| | | | |
|---|---|---|---|
| 2007/0091550 A1* | 4/2007 | Smith .................. | H05K 7/1488 |
| | | | 361/679.02 |
| 2007/0115627 A1* | 5/2007 | Carlisi ................... | G06F 1/183 |
| | | | 361/679.01 |
| 2007/0159791 A1* | 7/2007 | Pongracz .......... | H05K 7/20145 |
| | | | 361/688 |
| 2007/0171613 A1* | 7/2007 | McMahan .......... | H05K 7/20736 |
| | | | 361/695 |
| 2010/0101759 A1* | 4/2010 | Campbell .......... | H05K 7/20772 |
| | | | 165/80.4 |
| 2012/0104919 A1* | 5/2012 | Wu ...................... | H05K 7/1497 |
| | | | 312/334.28 |
| 2012/0155027 A1* | 6/2012 | Broome .............. | H05K 7/2039 |
| | | | 361/688 |
| 2014/0055959 A1* | 2/2014 | Manda ................ | G11B 33/128 |
| | | | 361/728 |
| 2020/0281090 A1* | 9/2020 | Huangfu ............. | H05K 7/1489 |

* cited by examiner

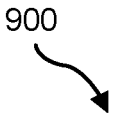

Rotatably couple a support structure to a server rack such that the support structure is rotatable about a vertical axis from a closed position to an open position
910

Mount at least one server chassis vertically to the support structure in a position to align the at least one server chassis with a lateral width of the server rack when the support structure is in the closed position.
920

*FIG. 9*

APPARATUSES, SYSTEMS, AND METHODS FOR MOUNTING CHASSIS IN A SHORT DEPTH SERVER RACK

BACKGROUND

Computer server racks in data centers are used to stack server chassis carrying various computing, data storage, and networking components. These components may include modules for processing, storage, network control and communication, power supply, etc. The configuration of server racks allows for efficient use of space to house such modules.

Operation of computer components in server racks can generate significant heat, which can damage, limit the life of, and/or create inefficiencies in the operation of the modules. Therefore, cooling systems are commonly used to withdraw heat from the server racks. The cooling systems are often based on forcing air to flow across the server chassis and through or along the modules therein, such as with fans that force air through the server racks.

Many server racks are arranged with a front facing an aisle for access to the server chassis, such as for monitoring, maintenance, installation, and/or replacement of components. The components are also mounted in the server chassis for ease of access from the front aisle side. Airflow may more efficiently cool components in the server chassis when passing over and through the server chassis from front to back. However, some server racks are designed for cooling air to flow side-to-side through the server racks. For example, to conserve space, server racks may have a reduced depth that does not allow sufficient space for a fan module in a back thereof.

FIG. 1 is a perspective view of a conventional server rack 100 showing side-to-side airflow in dashed arrows through the server rack 100. Server chassis 102, each with computing components mounted therein, are oriented horizontally and stacked over each other. The server rack 100 may have a short depth D1 from a front, aisle side to a back of the server rack 100, such as less than 450 mm (e.g., 400 mm, 350 mm, 300 mm, etc.). To improve cooling, the cooling air may be directed by baffles 104 from an inlet side 106 of the server rack 100 to the front of the server chassis 102 to flow through the server chassis 102 from front to back. The air may then flow out of the server rack 100 through an outlet side 108 of the server rack 100 opposite the inlet side. For example, a fan module 110, which may be mounted on the outlet side 108 of the server rack 100, may be used to force the air to flow through the server rack 100 from side-to-side.

The addition of the baffles 104 may add to the cost and complexity of the server rack 100. Servicing the components in the server chassis 102, such as to maintain or replace the components, may require removing the server chassis 102 from the server rack 100 and potentially disconnecting (e.g., powering down and unplugging cables) the components of the server chassis 102.

The instant disclosure, therefore, identifies and addresses a need for additional and/or improved apparatuses, systems, and methods for mounting server chassis in a short-depth server rack.

SUMMARY

As will be described in greater detail below, the instant disclosure generally relates to apparatuses, systems, and methods for mounting server chassis in a server rack, such as a short-depth server rack. In one example, a server rack may include an enclosure having a depth from a front to a back of the enclosure and a width between a first lateral sidewall and a second, opposite lateral sidewall of the enclosure. The enclosure may include an airflow inlet in the first lateral sidewall and an airflow outlet in the second lateral sidewall for flowing air from the first lateral sidewall to the second lateral sidewall. A support structure may be rotatably mounted to the enclosure and rotatable between an open position and a closed position. At least one chassis mount on the support structure may be oriented to vertically mount server chassis to the support structure such that the server chassis are aligned with the width of the enclosure when the support structure is in the closed position.

Similarly, a mounting system for server chassis in a server rack may include a support structure including at least one chassis mount oriented to vertically mount server chassis to the support structure. The mounting system may also include a hinge for rotatably mounting the support structure to a server rack. The hinge may have a vertical rotational axis and may be configured to rotate the support structure from a closed position within the server rack to an open position at least partially outside of the server rack.

A corresponding method may include rotatably coupling a support structure to a server rack such that the support structure is rotatable about a vertical axis from a closed position to an open position. The method may also include mounting at least one server chassis vertically to the support structure in a position to align the at least one server chassis with a lateral width of the server rack when the support structure is in the closed position.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the instant disclosure.

FIG. 9 is a flow diagram of an example method for mounting server chassis in a server rack in accordance with one or more embodiments of this disclosure.

Figure 1:
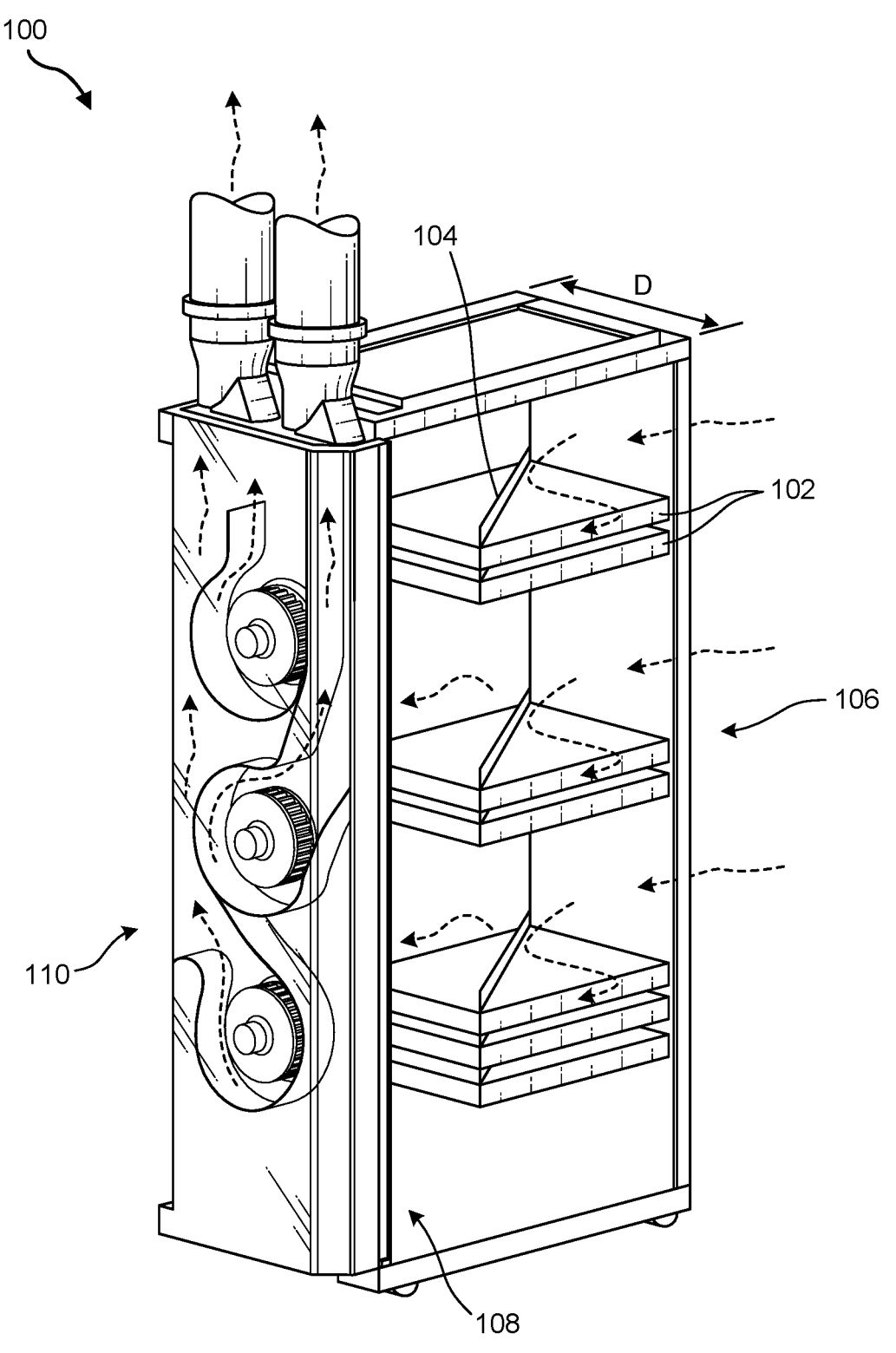
FIG. 1 is a perspective view of a conventional server rack showing side-to-side airflow through the server rack.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure describes various apparatuses, systems, and methods for mounting server chassis in a server rack. As will be explained in greater detail below, embodiments of the present disclosure may involve rotatably mounting a support structure to a server rack enclosure and supporting, with the support structure, multiple server chassis in a vertical orientation. When the support structure is rotated into a closed position within the enclosure of the server rack, the server chassis may be aligned with side-to-side airflow passing through the server rack.

Accordingly, the present disclosure may provide the ability to use server chassis that have a depth greater than a short server rack depth. For example, the server chassis may be 350 mm deep while the server rack depth may be 300 mm deep. In addition, the present disclosure may enable a technician to more easily access the server chassis by rotating the support structure into an open position at least partially outside (e.g., in front of) the server rack. In this open position, the technician may be able to access both a front and a back of the server chassis, such as for maintenance, testing, and/or replacement of computer components of the server chassis including both front and rear field-replaceable units. The maintenance and testing may even be performed without electrically disconnecting the server chassis, if desired.

The conventional server rack with side-to-side airflow of FIG. 1 was described above. The following will provide, with reference to FIGS. 2-8, detailed descriptions of various aspects of server racks and mounting systems for mounting server chassis, according to examples of the present disclosure. Detailed descriptions of an example method for mounting server chassis in a server rack will be provided in connection with FIG. 9.

Figure 2:
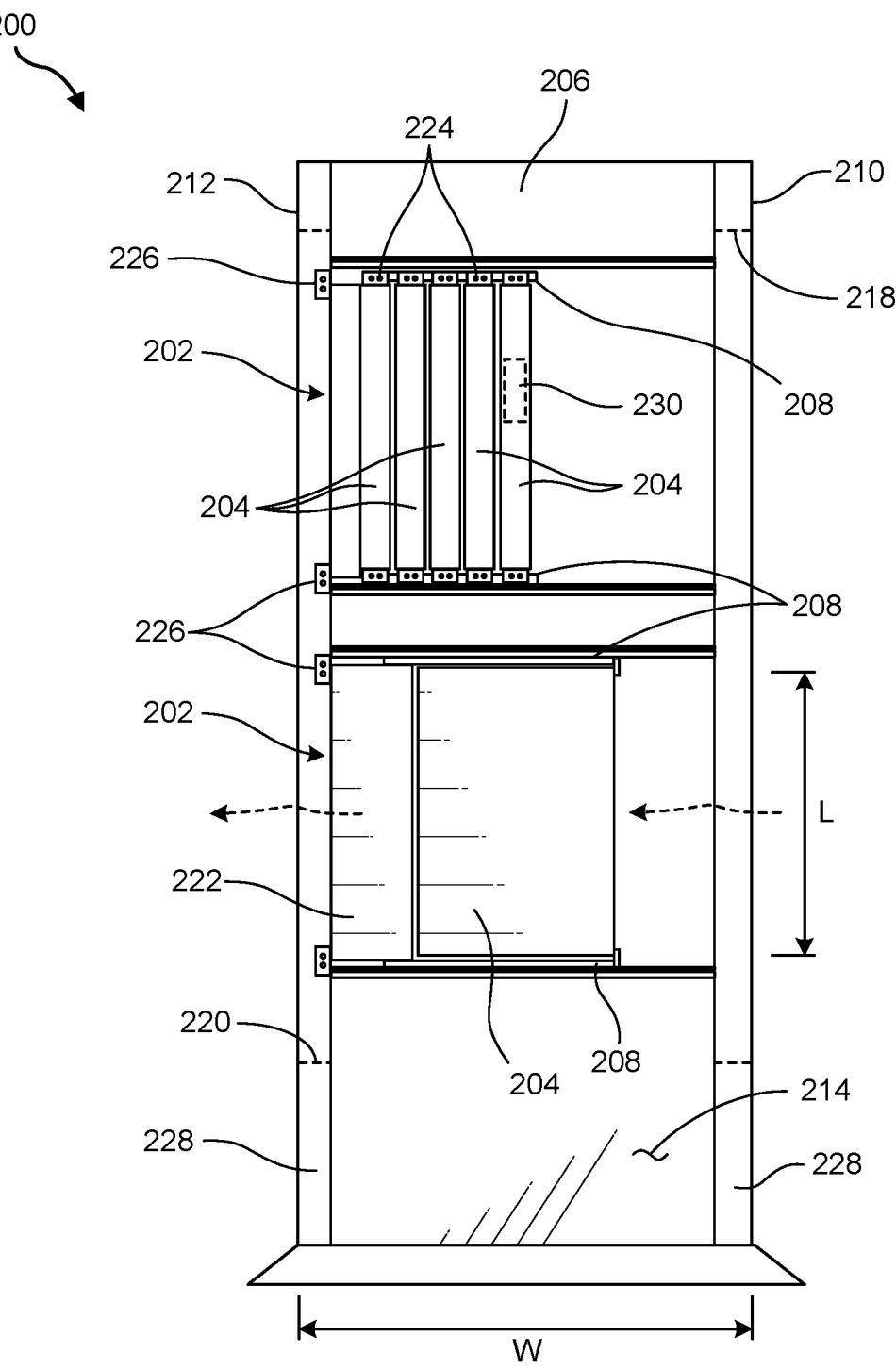
FIG. 2 is a front view of a server rack with a support structure for server chassis in accordance with one or more embodiments of this disclosure.
Figure 3:
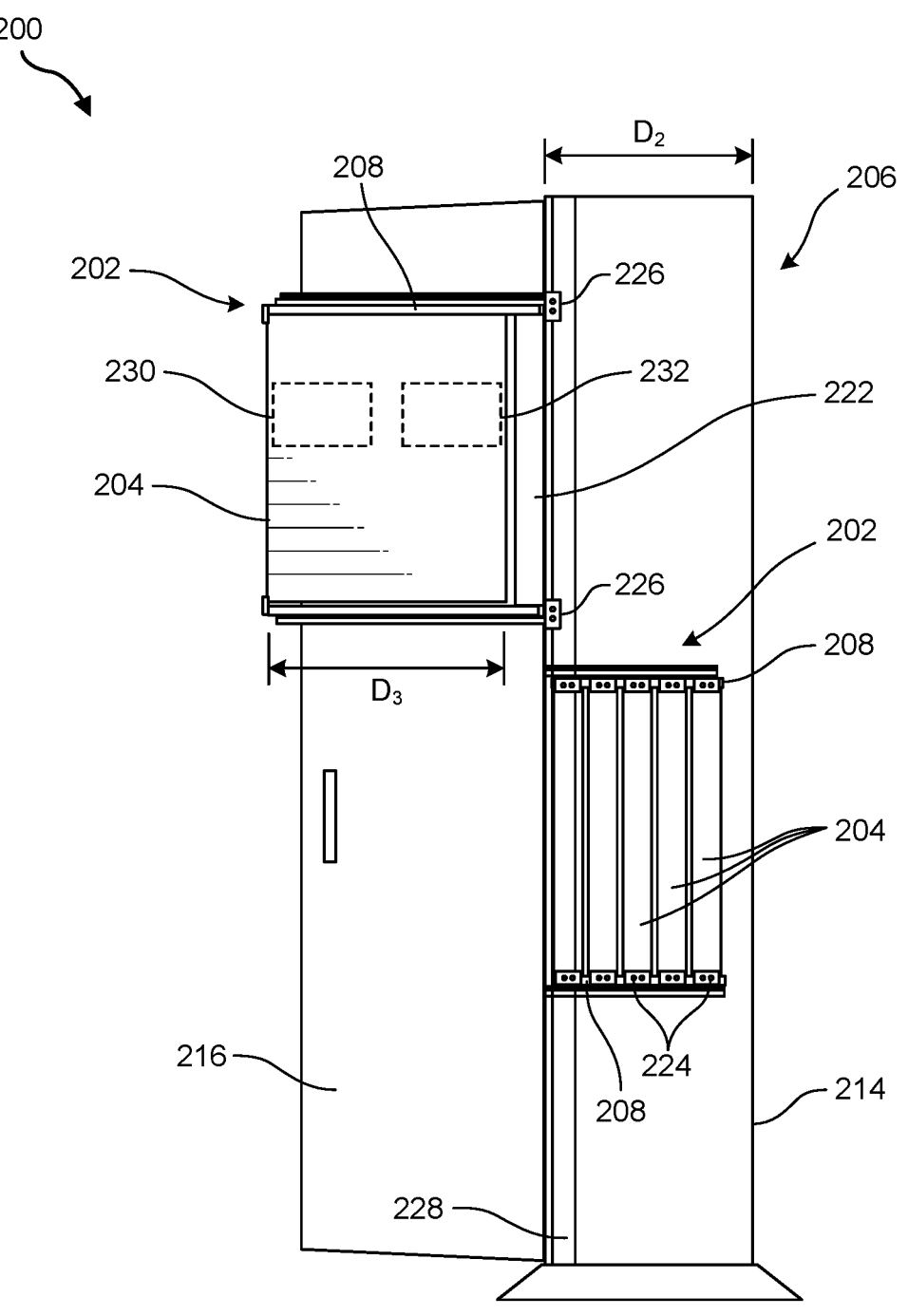
FIG. 3 is a side view of a server rack with a support structure for server chassis in accordance with one or more additional embodiments of this disclosure.

FIG. 2 is a front view of a server rack 200 with a support structure 202 for server chassis 204 in accordance with one or more embodiments of this disclosure. FIG. 3 is a side view of the server rack 200 of FIG. 2.

The server rack 200 may include an enclosure 206, the support structure 202 rotatably mounted to the enclosure 206, and at least one chassis mount 208 on the support structure 202.

The enclosure 206 may be defined by a first lateral sidewall 210, a second, opposite lateral sidewall 212, and a back wall 214. In some embodiments, a front door 216 (or cover) may also be included for access to an interior of the enclosure 206. The front door 216 is not shown in FIG. 2 in order to better see the internal components of the server rack 200, and is shown in FIG. 3 in an open position. A width W (FIG. 2) of the enclosure 206 may be between the first lateral sidewall 210 and the second lateral sidewall 212. The enclosure 206 may have a depth D2 (FIG. 3) from a front to a back of the enclosure 206 (e.g., from the front door 216 when closed to the back wall 214). The first lateral sidewall 210 may include an airflow inlet 218 and the second lateral sidewall 212 may include an airflow outlet 220 for flowing air side-to-side through the server rack 200 from the first lateral sidewall 210 to the second lateral sidewall 212.

The support structure 202 may include a support element 222. The support element 222 may include a beam, bracket, and/or other element for physically supporting the server chassis 204. For example, the chassis mount(s) 208 may be secured to, or a part of, the support element 222. The server chassis 204 may be secured to the chassis mount(s) 208, such as with a bolt 224, clip, or the like.

The support structure 202 may be rotatably mounted to the enclosure 206 via one or more hinges 226. For example, as shown in FIGS. 2 and 3, an upper hinge element and a lower hinge element may be used to rotatably mount, respectively, an upper portion and a lower portion of each support structure 202 to the enclosure 206. The hinges 226 may be positioned and secured to the enclosure 206 proximate the front (e.g., just behind the front door 216) of the enclosure 206. For example, the server rack 200 may include vertical supports 228 that may typically be used for mounting server chassis 204 in a horizontal orientation. The hinges 226 may be mounted to one of the vertical supports 228. The hinges 226 may have a vertical rotational axis, such that the support structure 202, and consequently the chassis mounts 208 and server chassis 204, may rotate about the vertical rotational axis between open and closed positions.

The upper portions of FIGS. 2 and 3 illustrate the support structure 202 rotated into an open position with the support structure 202 at least partially outside of (e.g., in front of) the server rack 200. The lower portions of FIGS. 2 and 3 illustrate the support structure 202 rotated into a closed position, with the support structure 202 fully within the server rack 200.

The chassis mount(s) 208 may be oriented on the support structure 202 to vertically mount the server chassis 204, such that the server chassis 204 are aligned with the width W of the enclosure 206 when the support structure 202 is in the closed position, as illustrated in the lower portions of FIGS. 2 and 3. In other words, a length L (FIG. 2) of the server chassis 204 may be oriented vertically. In some examples, the chassis mount(s) 208 may include an upper chassis mount 208 and a lower chassis mount 208 to respectively secure opposing sides of the server chassis 204 to the support structure 202. By way of example and not limitation, the chassis mount(s) 208 may include a perforated beam, with perforations being sized and shaped for passing a bolt, clip, or other fastener therethrough for coupling the server chassis 204 to the chassis mount(s) 208.

As shown in FIGS. 2 and 3, when the support structure 202 is rotated into the open position, a front field-replaceable unit (FRU) 230 of the server chassis 204 may be accessible for maintenance, removal, replacement, testing, and the like. As can be seen in FIG. 3, a rear FRU 232 may also be accessible when the support structure 202 is rotated into the open position. The front FRU 230 and/or the rear FRU 232 may be accessible without removing the server chassis 204 from the support structure 202.

The enclosure 206 may be a short-depth enclosure, such as having a depth D2 of less than 450 mm, such as in the range of about 300 mm to about 400 mm. The support structure 202 that is rotatably mounted to the enclosure 206 may enable the use of server chassis 204 that have a chassis depth D3 (FIG. 3) of more than the depth D2 due to the space available across the width W (FIG. 2) when the support structure 202 is in the closed position. By way of example, the chassis depth D3 may be about 350 mm when the depth D2 of the enclosure 206 is about 300 mm. In additional examples, the chassis depth D3 may be less than the depth D2 of the enclosure 206. In this case, rotatably mounting the support structure 202 may still be advantageous for accessing the front and back of the server chassis 204, such as for maintenance, testing, and/or replacement of components of the server chassis 204.

Similarly, the width W of the enclosure 206 may be greater than the chassis depth D3 to accommodate the server chassis 204 when the support structure 202 is in the closed position. For example, the chassis depth D3 may be about 350 mm and the width W of the enclosure 206 may be about 450 mm or more, such as about 500 mm or about 600 mm.

In some examples, depending on the size of each server chassis 204 and the depth D2 of the enclosure 206, the support structure 202 may be sized to support at least three server chassis 204 adjacent to each other, such as three server chassis 204, four server chassis 204, five server chassis 204 (as illustrated in FIGS. 2 and 3), six server chassis 204, or more.

For purposes of describing aspects of the present disclosure, it is noted that relative terms, such as "about" and the like, may be utilized herein to represent an inherent degree of uncertainty that may be attributed to any quantitative comparison, value, measurement, or other representation. These terms can also be utilized herein to represent the degree by which a quantitative representation may vary from a stated reference without resulting in a change in the basic function of the subject matter at issue.

Figure 4:
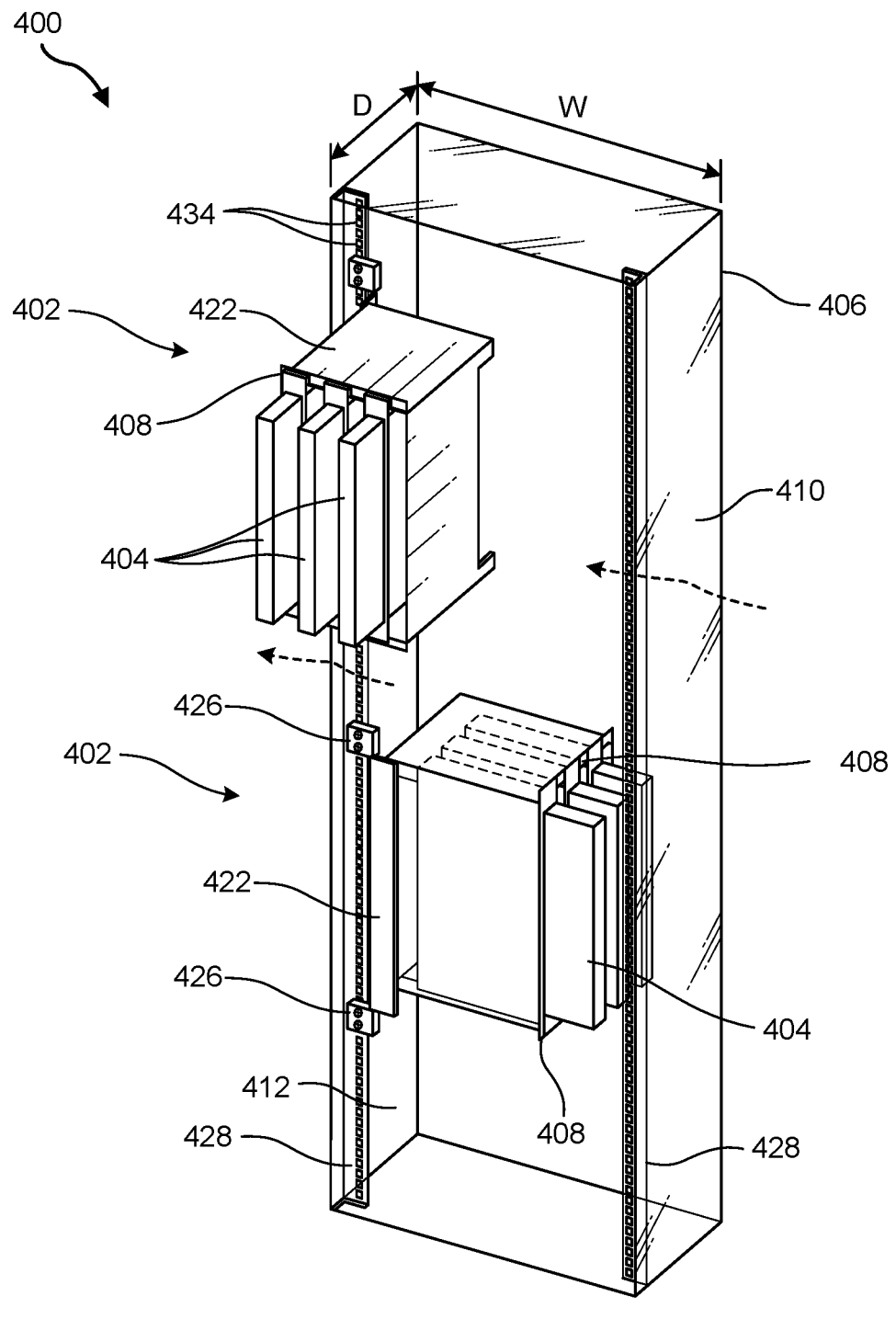
FIG. 4 is a perspective view of a server rack with an upper support structure in an open position and a lower support structure in a closed position in accordance with one or more embodiments of this disclosure.
Figure 5:
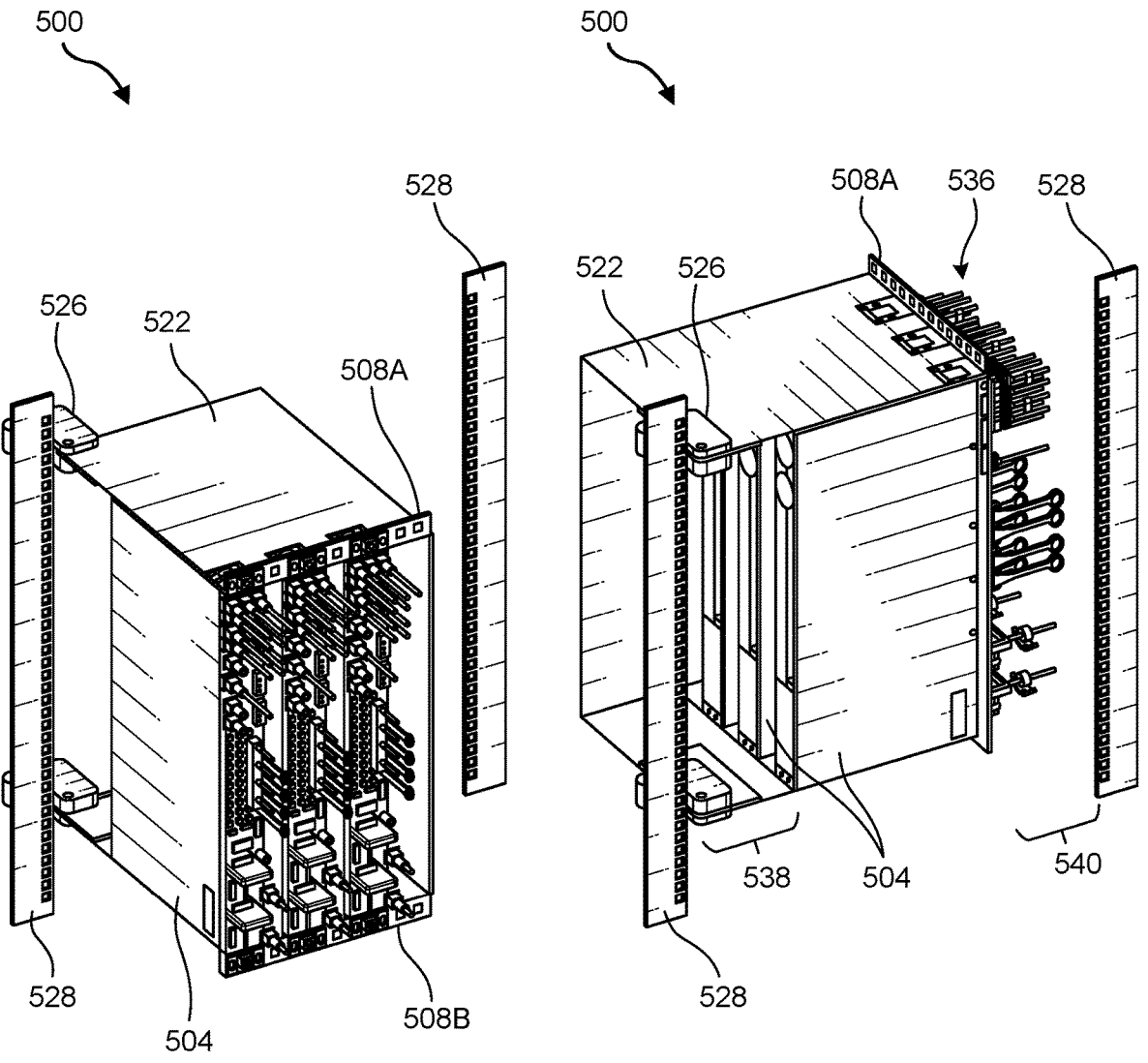
FIGS. 5A and 5B are perspective views of a support structure for server chassis in open and closed positions, respectively, in accordance with one or more embodiments of this disclosure.

FIG. 4 is a perspective view of a server rack 400 with an upper support structure 402 in an open position and a lower support structure 402 in a closed position in accordance with one or more embodiments of this disclosure. In some respects, the server rack 400 of FIG. 4 may be similar to the server rack 200 of FIGS. 2 and 3. For example, the server rack 400 may include the support structures 402 for supporting server chassis 404 in a vertical orientation. An enclosure 406 may have a depth D from a front to a back of the enclosure 406 and may have a width W from a first lateral sidewall 410 to a second lateral sidewall 412. The depth D may be short, such as less than 450 mm (e.g., between about 300 mm and about 400 mm). In some examples, the depth D may be less than the width W of the enclosure 406. When the server rack 400 is in use, airflow (shown by dashed arrows) may pass side-to-side through the enclosure 406, such as from the first lateral sidewall 410 to the second lateral sidewall 412.

The support structures 402 may be rotatable, such as by using one or more hinges 426, relative to the enclosure 406. For example, the hinges 426 may have a vertical rotational axis about which the support structures 402 may rotate. The hinges 426 may be mounted to the enclosure 406 along vertical supports 428.

Chassis mounts 408 on the support structure 402 may be oriented to vertically mount the server chassis 404 to the support structure, such that the server chassis 404 are aligned with the width W when the support structure 402 is in the closed position. For example, the server chassis 404 mounted to the support structure 402 may be positioned (e.g., horizontally stacked) adjacent to each other as shown in FIG. 4, like books in a bookshelf. A support element 422 of the support structure 402 may structurally couple the chassis mounts 408 to the hinges 426.

As illustrated in FIG. 4, the vertical supports 428 to which the support structures 402 are mounted via the hinges 426 may be or include perforated beams, such as angle irons with holes or recesses 434 along a length thereof. The holes or recesses 434 may be provided for attaching the hinges 426 thereto, such as with one or more bolts, clips, or the like. In some examples, the holes or recesses 434 may be positioned only in locations where the hinges 426 are to be attached. In additional examples, such as in the example shown in FIG. 4, multiple holes or recesses 434 may be provided along the vertical supports 428, such that the hinges 426 can be attached to the vertical supports 428 at any desired height or position. In this manner, support structures 402 of different heights and/or in different locations may be used for a variety of different configurations and applications.

FIGS. 5A and 5B are perspective views of a support structure 500 for server chassis 504 in open and closed positions, respectively, in accordance with one or more embodiments of this disclosure. In some respects, the support structure 500 may be similar to the support structures 202, 402 discussed above with reference to FIGS. 2-3 and 4. For example, the support structure 500 may include a support element 522 that structurally couples an upper chassis mount 508A and a lower chassis mount 508B (collectively referred to as chassis mounts 508) to hinges 526. The hinges 526 may be mounted to vertical supports 528. The chassis mounts 508 may be oriented and configured for vertically mounting multiple server chassis 504 to the support structure 502.

As illustrated in FIGS. 5A and 5B, each of the server chassis 504 may include multiple hardware modules, such as for processing, storage, network control and communication, power supply, etc. These modules may include structures 536, such as plugs, cables, handles, heat sinks, etc., that extend from a front and/or back of the server chassis 504. Accordingly, the support structure 500 may be sized and positioned to accommodate the structures 536.

For example, the support structure 500 may include a rear space 538 for accommodating any structures 536 that may extend from a back of the server chassis 504. A front space 540 may also be provided in front of the server chassis 504 (e.g., between the chassis mounts 508 and the vertical support 528 opposite the hinges 526) when the support structure 500 is in the closed position (e.g., as shown in FIG. 5B). By way of example and not limitation, the rear space 538 and the front space 540 may each be at least 50 mm, such as about 100 mm or about 150 mm.

Figure 6:
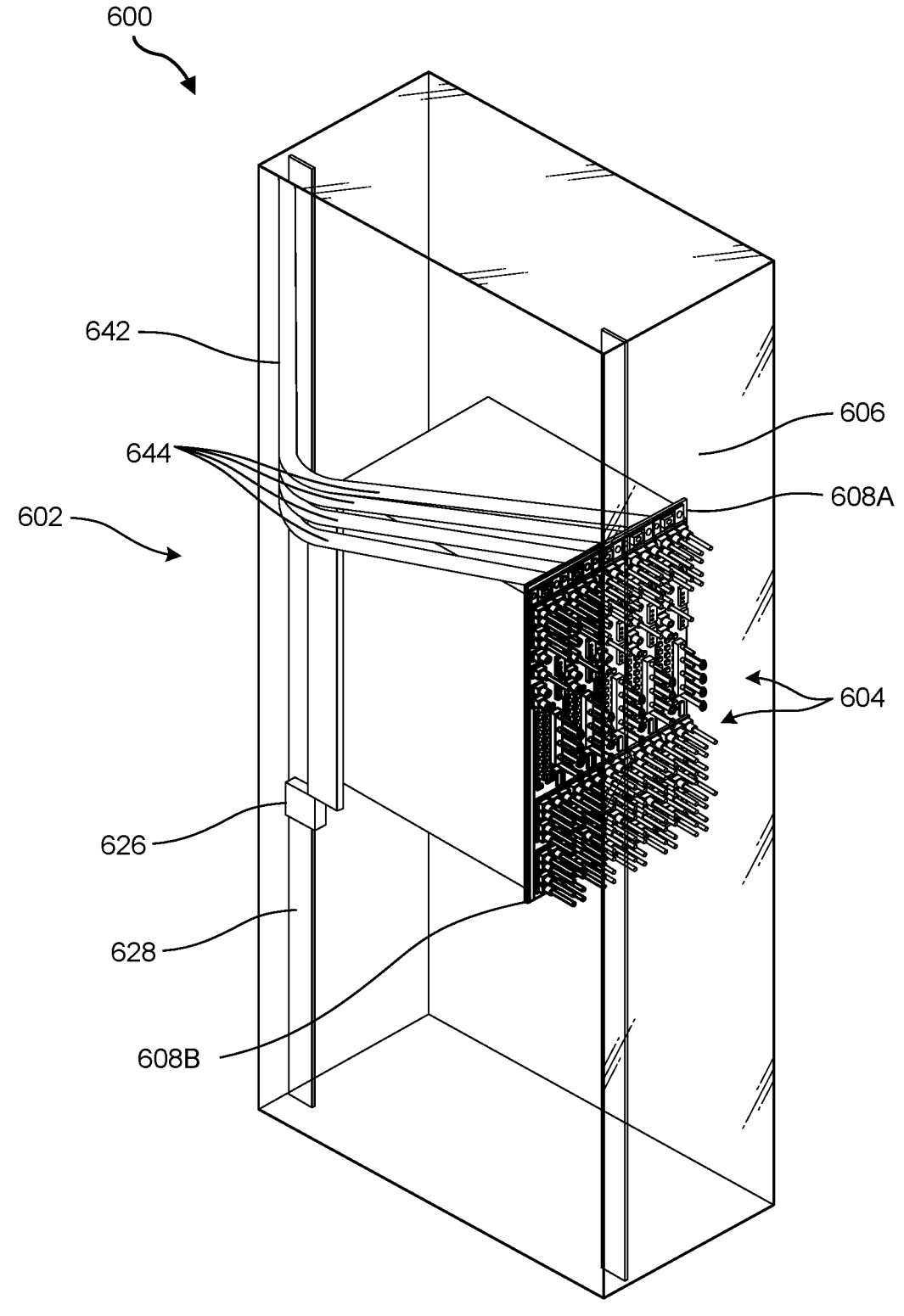
FIG. 6 is a perspective view of a server rack with a support structure for server chassis in a closed position in accordance with one or more embodiments of this disclosure.
Figure 7:
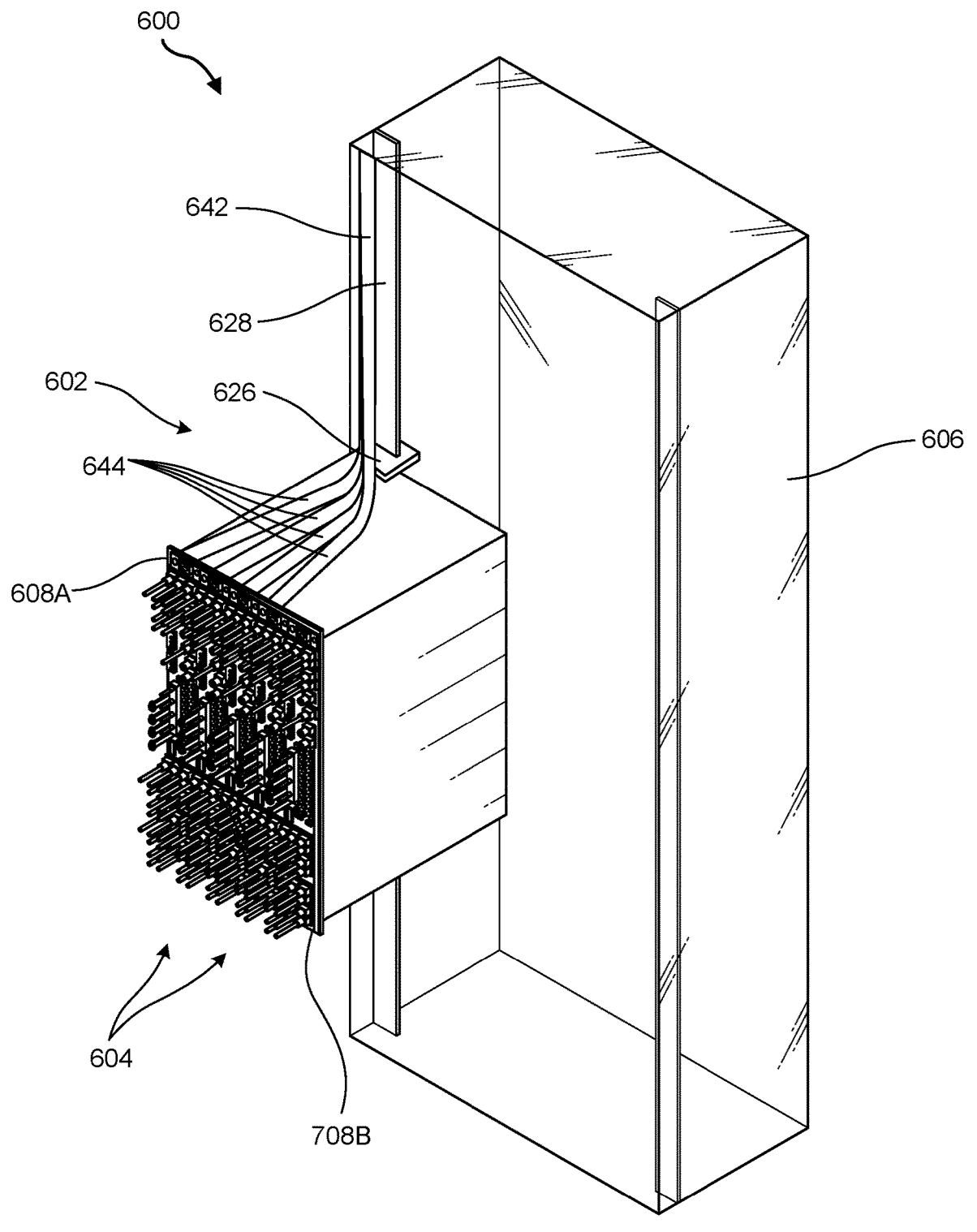
FIG. 7 is a perspective view of the server rack of FIG. 6, with the support structure in an open position.

FIG. 6 is a perspective view of a server rack 600 with a support structure 602 for server chassis 604 in a closed position in accordance with one or more embodiments of this disclosure. FIG. 7 is a perspective view of the server rack 600, with the support structure 602 in an open position. In some respects, the server rack 600 of FIGS. 6 and 7 may be similar to the server rack 200 of FIG. 2. For example, the server rack 600 may include a support structure 602 rotatably mounted to an enclosure 606 via hinges 626 attached to a vertical support 628. The support structure 602 may be rotatable between an open position (shown in FIG. 6) and a closed position (shown in FIG. 7). The hinges 226 may have a vertical rotational axis. Server chassis 604 may be vertically mounted to the support structure via an upper chassis mount 608A and a lower chassis mount 608B.

As illustrated in FIGS. 6 and 7, a cable bundle 642 may include cables 644 operably connected to the server chassis 604. The cables 644 may be or include power cables for supplying power to the server chassis 604, data transfer cables (e.g., coaxial cables, ethernet cables, fiber optic cables, etc.), and/or other cables.

The cable bundle 642 may be positioned to allow the support structure 602 to rotate between the open and closed positions without tangling, overstretching, or disconnecting the cables 644. For example, the cable bundle 642 may extend along vertical support 628 above or below the support structure 602 near the rotational axis of the hinges 626. Once the cable bundle 642 reaches the support structure 602, the cables 644 may be routed to the respective server chassis 604 supported by the support structure 602. In this manner, the cables 644 may remain operably connected to the respective server chassis 604 when the support structure 602 is in the open position, without disconnecting the cables 644.

Using this configuration and placement of the cable bundle 642, the support structure 602 and server chassis 604 may be freely rotated between the closed and open positions without disconnecting, powering down, or otherwise interrupting operation of the server chassis 604. Thus, maintenance, inspections, testing, and other interactions may be performed while the server chassis 604 are operating. This may be advantageous for reducing downtime and/or for enabling inspection and testing while the server chassis 604 and any components thereof (including components in a front or in a back of the server chassis 604) are operating.

Figure 8:
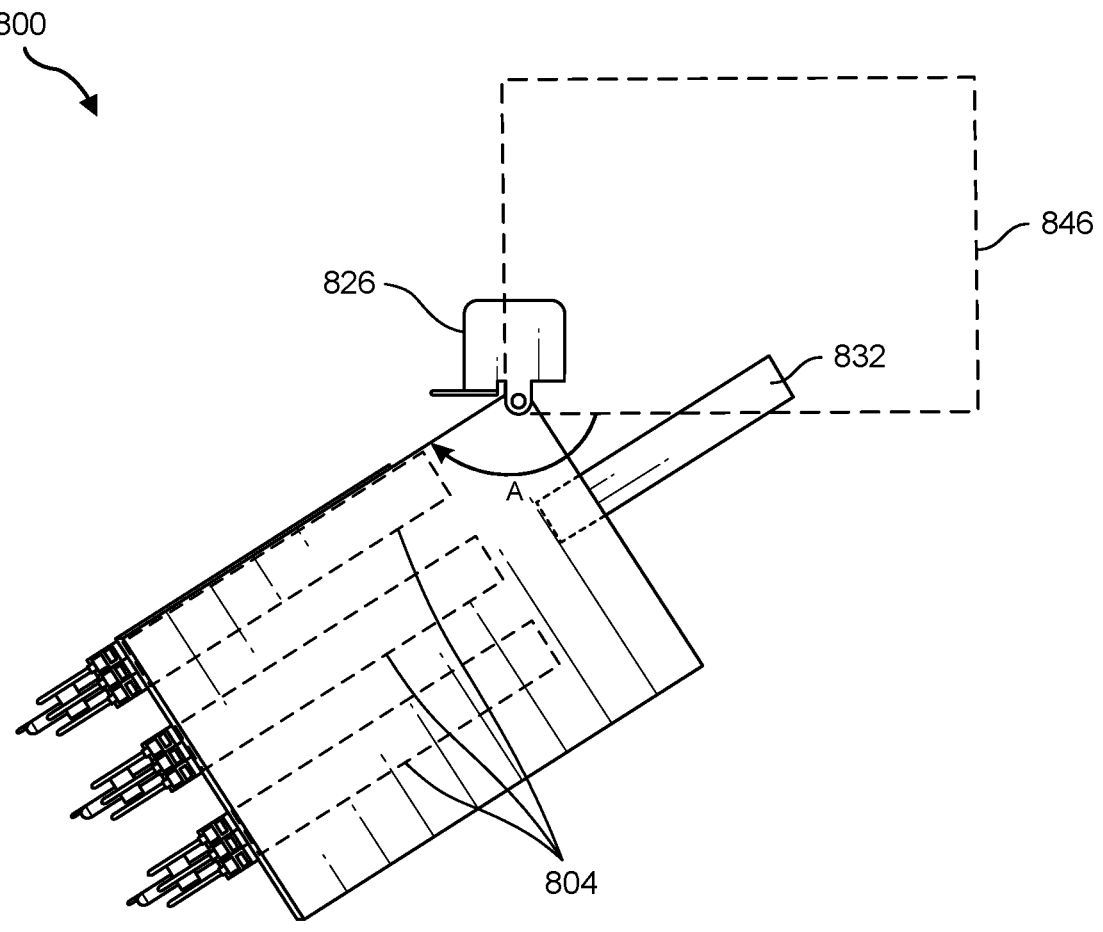
FIG. 8 is a top view of a support structure for supporting server chassis in accordance with one or more embodiments of this disclosure.

FIG. 8 is a top view of a support structure 800 for supporting server chassis 804 in accordance with one or more embodiments of this disclosure. The support structure 800 may be configured for supporting multiple server chassis 804 adjacent to each other in a vertical orientation, as discussed above. The support structure 800 may be rotatably mounted to a server rack enclosure via hinges 826 having a vertical rotational axis. The support structure 800 is illustrated in FIG. 8 in an open position in solid lines and in a closed position 846 in dashed lines.

As can be seen in FIG. 8, the support structure 800 may be coupled to the hinges 826 near a front corner of the support structure 800. This positioning may facilitate rotating the support structure 800 from the closed position 846 to the open position. In some examples, an angle A between the support structure 800 in the closed position 846 to the support structure 800 in the open position may be at least 90 degrees.

By configuring the support structure 800 to rotate outward by at least 90 degrees, rear FRUs 832 may be accessible and removable by a technician. For example, as shown in FIG. 8, there may be sufficient space behind the support structure to remove the rear FRU 832 from a server chassis 804 when the support structure 800 is in the open position. In some examples, removing the rear FRU 832 may be accomplished without removing the associated server chassis 204 from the support structure 800.

The greater the angle A can be increased, the easier it may be for the technician to reach and manipulate the rear FRU 832. Accordingly, in some examples the hinge 826 and support structure 800 may be configured such that the angle A is more than 90 degrees, such as 120 degrees, 135 degrees, or more.

FIG. 9 is a flow diagram of an example method 900 for mounting server chassis in a server rack in accordance with one or more embodiments of this disclosure. In operation 910, a support structure may be rotatably coupled to a server rack such that the support structure is rotatable about a vertical axis from a closed position (e.g., with the support structure fully inside the server rack) to an open position (e.g., with the support structure at least partially outside the server rack). Operation 910 may be performed in a variety of ways. For example, the server rack may include one or more vertical supports. One or more hinges may rotatably couple the support structure to the vertical support(s). The hinge may be configured to allow the support structure to rotate at least 90 degrees between the closed position and the open position, such as 90 degrees, 120 degrees, 135 degrees, or more.

At operation 920, at least one server chassis may be mounted vertically to the support structure to align the at least one server chassis with a lateral width of the server rack when the support structure is in the closed position. Operation 920 may be performed in a variety of ways. For example, the support structure may include a chassis mount along a top edge thereof for coupling a side of a server chassis thereto. Another chassis mount may also be positioned along a bottom edge of the support structure for coupling an opposing side of the server chassis thereto. Multiple server chassis may be mounted to the support structure in this fashion and positioned adjacent to each other with a length of each server chassis positioned vertically. Cooling air may be directed through the server rack from side-to-side, along and between the server chassis mounted parallel to the airflow.

Cables may be connected to the server chassis, such as power cables and/or data transfer cables. The cables may be provided in a cable bundle, which may be coupled to the server rack along the vertical support to which the hinges are connected.

Accordingly, the present disclosure includes server racks, mounting systems for server chassis in a server rack, and related methods that can improve mounting of and access to the server chassis. The server racks may include a support structure that is rotatably mounted to an enclosure of the server racks. The support structure may be configured for supporting the server chassis in a vertical orientation to be aligned with side-to-side airflow through the server racks. The support structure may be rotatable about a vertical axis from a closed position within the server rack to an open position at least partially outside of the server rack. These features may be employed in short-depth server racks, such as 300 mm deep server racks.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of designs and/or configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and/or scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A server rack, comprising:
an enclosure having a depth from a front to a back of the enclosure and a width between a first lateral sidewall and a second, opposite lateral sidewall of the enclosure, wherein the depth of the enclosure is less than the width of the enclosure, the enclosure including an airflow inlet in the first lateral sidewall and an airflow outlet in the second lateral sidewall for flowing air from the first lateral sidewall to the second lateral sidewall;
a support structure rotatably mounted to the enclosure and rotatable between an open position and a closed position, wherein the support structure is rotatably mounted to the enclosure via a hinge positioned proximate an intersection between the first lateral sidewall and the front of the enclosure; and
at least one chassis mount on the support structure oriented to vertically mount multiple server chassis to the support structure such that each of the server chassis is parallel to the width of the enclosure when the support structure is in the closed position, and the multiple server chassis rotate at least partially outside of the enclosure when the support structure is in the open position for access to the multiple server chassis.

2. The server rack of claim 1, wherein the depth of the enclosure is less than 450 mm.

3. The server rack of claim 2, wherein the depth of the enclosure is in the range of about 300 mm to about 400 mm.

4. The server rack of claim 1, wherein the hinge has a vertical rotational axis.

5. The server rack of claim 1, wherein an angle between the support structure in the closed position and the support structure in the open position is at least 90 degrees.

6. The server rack of claim 5, wherein the angle between the support structure in the closed position and the support structure in the open position is at least 135 degrees.

7. The server rack of claim 1, wherein the at least one chassis mount comprises an upper chassis mount and a lower chassis mount for respectively securing a first side of the server chassis to the upper chassis mount and an opposite, second side of the server chassis to the lower chassis mount.

8. The server rack of claim 1, wherein, when the support structure is rotated to the open position, the server chassis are accessible to replace a field-replaceable unit of the server chassis from a back of the server chassis without removing the server chassis from the support structure.

9. The server rack of claim 1, further comprising a cable bundle including cables positioned to remain operably connected to the respective server chassis when the support structure is in the closed position and in the open position for access to the server chassis when the support structure is in the open position without disconnecting the cables.

10. The server rack of claim 9, wherein the cables of the cable bundle comprise power cables for supplying power to the server chassis.

11. The server rack of claim 9, wherein the cables of the cable bundle comprise data transfer cables.

12. A mounting system for server chassis in a server rack, the mounting system comprising:
a support structure including at least one chassis mount oriented to vertically mount multiple server chassis to the support structure; and
a hinge for rotatably mounting the support structure to a server rack, the hinge having a vertical rotational axis and being configured to rotate the support structure from a closed position within the server rack to an open position at least partially outside of the server rack, wherein the multiple server chassis are parallel to a lateral width of the server rack when the support structure is in the closed position, wherein:
the support structure has a lateral width that fits within the server rack in the closed position from a first lateral sidewall to a second, opposite lateral sidewall of the server rack and has a depth from a front to a back of the server rack, wherein the depth is less than the width, and
the hinge is positioned proximate an intersection between the first lateral sidewall and the front of the server rack.

13. The mounting system of claim 12, wherein the hinge comprises an upper hinge element and a lower hinge element configured for rotatably mounting, respectively, an upper portion and a lower portion of the support structure to the server rack.

14. The mounting system of claim 12, wherein the at least one chassis mount comprises an upper chassis mount and a lower chassis mount for respectively securing a first side of the server chassis to the upper chassis mount and an opposite, second side of the server chassis to the lower chassis mount.

15. The mounting system of claim 12, wherein the at least one chassis mount comprises a perforated beam.

16. The mounting system of claim 12, wherein the hinge is configured to rotate the support structure across an angle of at least 90 degrees from the closed position to the open position.

17. The mounting system of claim 12, wherein the hinge is configured to rotate the support structure across an angle of at least 135 degrees from the closed position to the open position.

18. The mounting system of claim 12, wherein the support structure is sized to support at least three server chassis adjacent to each other.

19. A method comprising:
rotatably coupling a support structure to a server rack such that the support structure is rotatable about a vertical axis from a closed position within the server rack having a depth from a front to a back of the server rack and a width from a first lateral sidewall to a second, opposite lateral sidewall, to an open position at least partially outside the server rack, wherein the support structure is rotatably coupled to the enclosure via a hinge positioned proximate an intersection between the first lateral sidewall and a front of the server rack, wherein the depth is less than the width; and mounting multiple server chassis vertically to the support structure in a position such that the multiple server chassis are parallel with a lateral width of the server rack when the support structure is in the closed position and the multiple server chassis are accessible when the support structure is in the open position.

\* \* \* \* \*